(12) United States Patent
Katayama

(10) Patent No.: US 7,170,603 B2
(45) Date of Patent: Jan. 30, 2007

(54) POSITION DETECTION APPARATUS AND EXPOSURE APPARATUS

(75) Inventor: Shoshi Katayama, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 48 days.

(21) Appl. No.: 09/343,093

(22) Filed: Jun. 30, 1999

(65) Prior Publication Data
US 2003/0142313 A1    Jul. 31, 2003

(30) Foreign Application Priority Data
Jul. 3, 1998   (JP) .................................. 10-204496

(51) Int. Cl.
*G01B 11/00* (2006.01)
*G01B 11/14* (2006.01)
*G03B 27/32* (2006.01)
*G03F 9/00* (2006.01)
*G03C 5/00* (2006.01)

(52) U.S. Cl. ....................... 356/399; 356/401; 356/614; 355/77; 430/22; 430/30

(58) Field of Classification Search ........ 356/399–401; 250/548; 355/53, 55, 77; 430/5, 22, 30; 382/151
See application file for complete search history.

(56) References Cited

U.S. PATENT DOCUMENTS

| | | | | |
|---|---|---|---|---|
| 4,566,795 A * | 1/1986 | Matsuura et al. | ........... | 356/400 |
| 4,711,567 A * | 12/1987 | Tanimoto | ..................... | 355/53 |
| 4,780,616 A * | 10/1988 | Nishi et al. | ................. | 250/548 |
| 5,243,195 A * | 9/1993 | Nishi | ......................... | 250/548 |
| 5,633,720 A | 5/1997 | Takahashi | ................... | 356/401 |
| 5,745,242 A * | 4/1998 | Hata | ........................... | 356/401 |
| 5,760,878 A * | 6/1998 | Ogushi | ........................ | 355/53 |
| 5,798,195 A * | 8/1998 | Nishi | .......................... | 430/22 |
| 5,798,530 A | 8/1998 | Okumura | .................... | 250/548 |
| 5,978,071 A * | 11/1999 | Miyajima et al. | ............. | 355/53 |
| 6,051,843 A * | 4/2000 | Nishi | ......................... | 250/548 |
| 6,384,898 B1 * | 5/2002 | Inoue et al. | ................... | 355/53 |

FOREIGN PATENT DOCUMENTS

| | | |
|---|---|---|
| EP | 0 509 797 | 4/1992 |
| GB | 2 131 205 | 6/1984 |
| JP | 6-168867 | 6/1994 |

OTHER PUBLICATIONS

European Search Report dated Mar. 5, 2002, issued in corresponding European patent appln. No. 99305100, forwarded in a communication dated Mar. 21, 2002.

* cited by examiner

*Primary Examiner*—Gregory J. Toatley, Jr.
*Assistant Examiner*—Gordon J. Stock, Jr.
(74) *Attorney, Agent, or Firm*—Fitzpatrick, Cella, Harper & Scinto

(57) ABSTRACT

An exposure apparatus includes an image sensing section and image sensing control section for measuring the average position of a mark formed on a wafer during a predetermined observation period before a stage completely stops, an interferometer for measuring any deviation of the stage during the observation period, a stage deviation storage section for storing the measurement result by the interferometer in a memory and calculating the average deviation of the stage on the basis of the measurement result, and a shift amount calculation section for calculating the actual position of the mark, while the stage is at rest, on the basis of the average position of the mark and the average deviation of the stage.

10 Claims, 13 Drawing Sheets

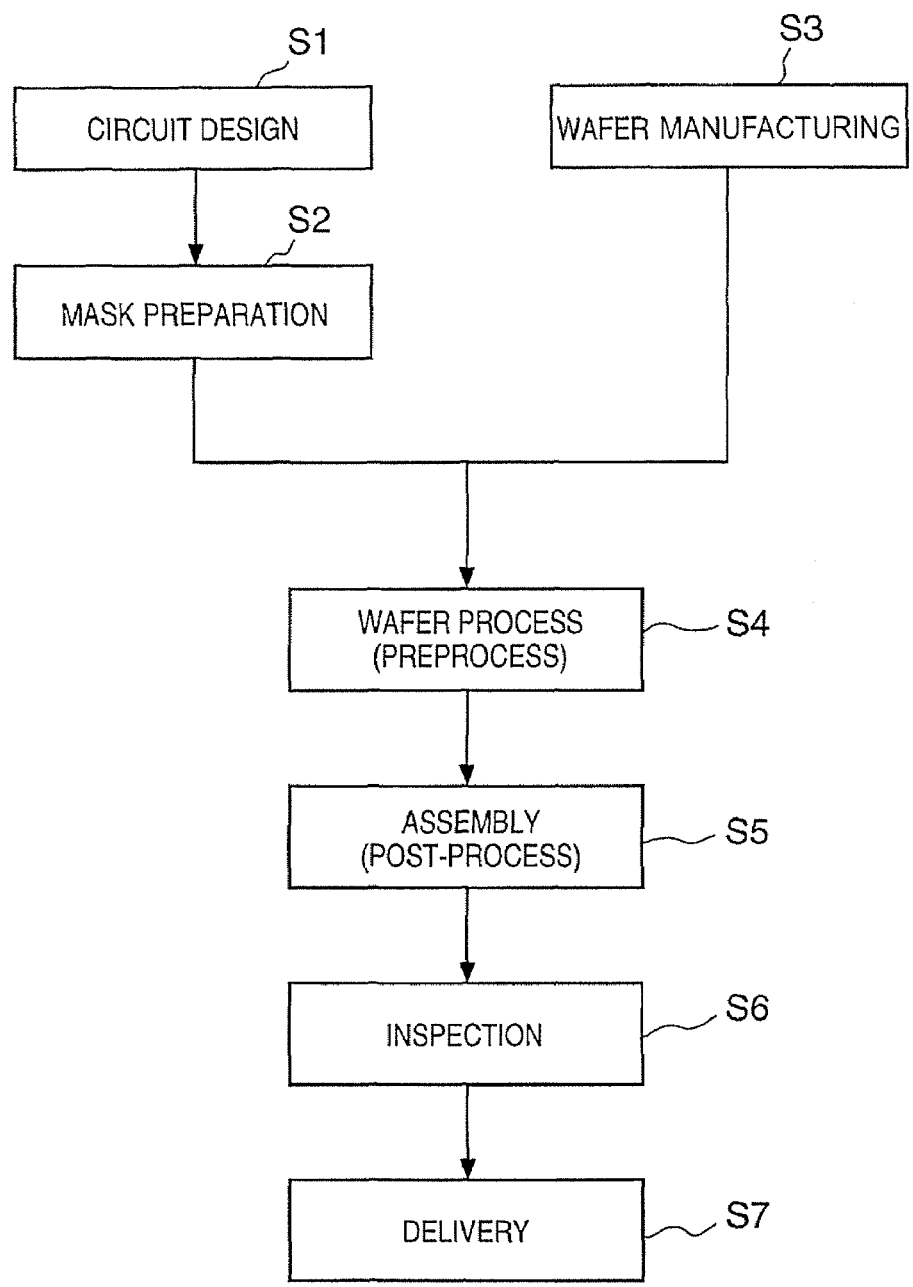

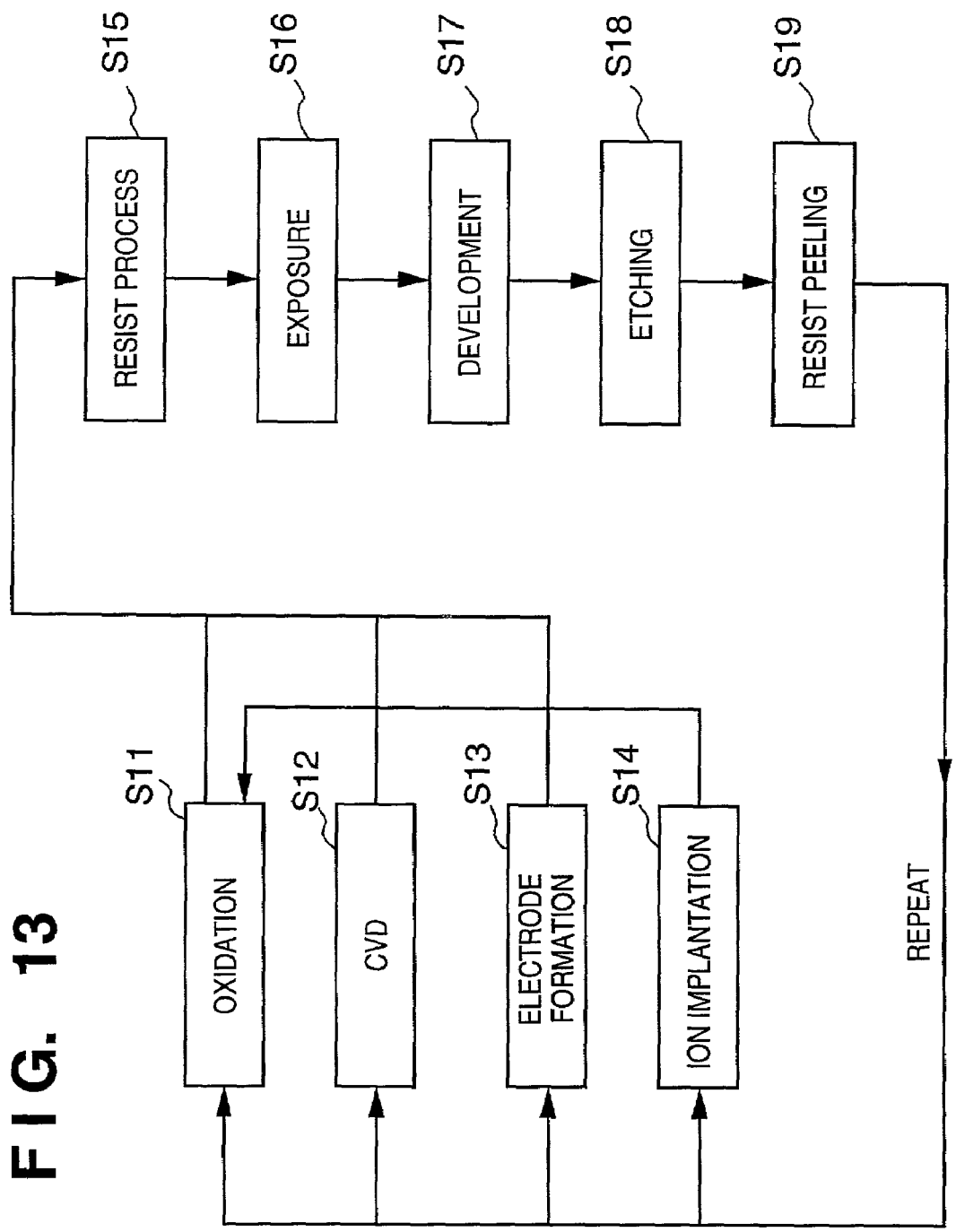

POSITION DETECTION APPARATUS AND EXPOSURE APPARATUS

BACKGROUND OF THE INVENTION

1. Field of the Invention

The present invention relates to a position detection apparatus and an exposure apparatus and, more particularly, to a detection apparatus for detecting the position of a mark formed on an object placed on a stage, and an exposure apparatus including the apparatus.

More specifically, the present invention is preferably applied to an apparatus for detecting the relative positional relationship between a pattern on an object such as a wafer and a stage on which the object is placed, or the relative positional relationship between the pattern on the object and a pattern on a mask such as a reticle when the pattern formed on the mask is to be transferred to the object.

The present invention is also preferably applied to an apparatus for manufacturing semiconductor devices such as ICs or LSIs, image sensing devices such as CCDs, display devices such as liquid crystal panels, or devices such as magnetic heads, and for example, to a proximity exposure apparatus, a projecting exposure apparatus (a so-called stepper), or a scanning exposure apparatus.

2. Description of the Related Art

In an exposure apparatus (e.g., a stepper) used to manufacture semiconductor elements, a pattern formed on a mask such as a reticle is projected onto a substrate such as a wafer through a projecting lens, thereby transferring the mask pattern to the substrate. To make the pattern to be transferred match the pattern already formed on the substrate, the position of an alignment mark formed on the substrate must be detected using an observation unit (e.g., an off-axis scope), and positioning (alignment) between the mask pattern and substrate pattern must be done on the basis of the detection result.

The position of the observation unit (e.g., an off-axis scope) is fixed. For this reason, to detect the position of the alignment mark, the stage must be driven to move the alignment mark on the wafer to the mark observation position (position where the position of the alignment mark can be detected by the observation unit).

After the positions of the stage in the X, Y, and θ directions are accurately measured by laser interferometers, the stage is moved to an arbitrary target position on the basis of the measurement result. In observing an alignment mark, generally, non-exposure light is used to minimize damage to the wafer.

The non-exposure light that irradiates the alignment mark and is reflected by the mark is sensed by an image sensing unit such as a CCD camera and received by the control unit of the exposure apparatus as an image signal. The position of the mark is detected by processing the image signal by the control unit.

When the mark is to be observed by an off-axis scheme such as the TTL off-axis scheme, wafer alignment can be performed by a global alignment scheme (AGA) including the above-described alignment mark measurement process.

In global alignment, the stage is driven to sequentially move alignment marks in predetermined shots to the mark observation position, and the alignment marks are observed by an observation unit. The step amount of the stage is corrected on the basis of the measurement results, i.e., alignment mark alignment/misalignment in all shots.

As advantages of this alignment scheme, measurement results that are obviously abnormal can be excluded from the alignment mark position measurement results, and since a plurality of measurement results are used, the reliability of the determined rotation and magnification components becomes high because of the averaging effect. When the rotation and magnification components are accurately measured by this alignment scheme, and the step amount of the stage is properly corrected, alignment errors during exposure become almost zero.

In observing an alignment mark on a wafer, the stage is driven. Especially, since alignment marks of a plurality of shots are observed in global alignment, the stage must be driven a number of times. To improve the throughput, every time the alignment mark in one shot is sequentially moved to the mark observation position, the stage must be quickly accelerated and stopped.

When the stage is driven to the mark observation position and stopped, processing waits until swing of the stage settles to a predetermined allowable range (tolerance). After this, an image signal is obtained by the CCD camera to measure the position of the alignment mark. However, when the stage is quickly accelerated and stopped, the entire exposure apparatus may swing, and a long time may be required for swing (variation) of the stage to subside.

In this case, the image signal obtained by the CCD camera contains the influence of a small swing (variation) of the stage during the image signal reception period. As a consequence, the alignment mark measurement result contains errors due to swing of the stage.

A projecting exposure apparatus has a mount system for settling swing of the apparatus main body due to step movement of the stage. When this mount system is adjusted, swing of the entire projecting exposure apparatus can be suppressed to some degree. However, when the mount system is adjusted to suppress swing caused by quick acceleration and stop of the stage, the stage may readily swing due to the influence of swing of the floor. Hence, conventionally, after the stage comes to a complete halt, an image signal is obtained by the CCD camera to measure the position of an alignment mark. As a result, the throughput cannot be improved conventionally.

SUMMARY OF THE INVENTION

According to the first aspect of the present invention, there is provided a position detection apparatus for detecting a position of a mark formed on an object placed on a stage, comprising an image sensing system averaging an image signal obtained by sensing an image of the mark formed on the object, a measurement system obtaining average data of a position deviation of the stage, and an arithmetic section calculating the position of the mark at a state that the stage is at rest on the basis of image data averaged by the image sensing system and a measurement result by the measurement system.

In the position detection apparatus according to the first aspect of the present invention, the image sensing system preferably stores image signals associated with the image of the mark during a predetermined observation period and obtains an average position of the mark during the observation period on the basis of the stored image signals.

In the position detection apparatus according to the first aspect of the present invention, the image sensing system and the measurement system preferably measure an average image signal of the mark and the average deviation of the stage during substantially the same observation period, respectively.

In the position detection apparatus according to the first aspect of the present invention, preferably, after the stage moves to a position where the measurement system can measure the position of the mark and before the stage stops, the image sensing system and the measurement system start measurement to obtain an average image signal of the mark and the average deviation of the stage, respectively.

In the position detection apparatus according to the first aspect of the present invention, the image sensing system comprises, e.g., an off-axis scope.

In the position detection apparatus according to the first aspect of the present invention, the measurement system comprises, e.g., an interferometer.

In the position detection apparatus according to the first aspect of the present invention, for example, the object has a plurality of areas, a mark is formed in correspondence with each area, and positions of the plurality of marks at a state that the stage is at rest are detected by the image sensing system, the measurement system, and the arithmetic section.

The position detection apparatus according to the first aspect of the present invention further comprises, e.g., a positioning control section for executing global alignment on the basis of detection results of the positions of the plurality of marks.

In the position detection apparatus according to the first aspect of the present invention, preferably, in an area where the image sensing system can measure the position of the mark, the image sensing system and the measurement system execute measurement to obtain an average image signal of the mark and the average deviation of the stage, respectively, while moving the stage at a predetermined speed, and the arithmetic section calculates the position of the mark, while the stage is at rest, on the basis of the measurement results. The predetermined speed is preferably, e.g., a constant speed.

According to the second aspect of the present invention, there is provided an exposure apparatus comprising a stage moving a substrate placed on a stage, a projecting lens projecting a pattern onto the substrate, first measurement means for measuring a position of a mark formed on the substrate on the basis of an average image signal of the mark, second measurement means for measuring an average deviation of the stage, calculation means for calculating the position of the mark at a state that the stage is at rest on the basis of a measurement result by the first measurement means and a measurement result by the second measurement means, and positioning means for driving the stage on the basis of a calculation result by the calculation means to position the substrate at a target position.

In the exposure apparatus according to the second aspect of the present invention, the first measurement means comprises image sensing means for sensing an image of the mark, the image sensing means storing image signals associated with the image of the mark during a predetermined observation period and obtaining an average position of the mark during the observation period on the basis of the stored image signals.

In the exposure apparatus according to the second aspect of the present invention, the first measurement means and the second measurement means measure an average position of the mark and the average deviation of the stage during substantially the same observation period, respectively.

In the exposure apparatus according to the second aspect of the present invention, after the stage moves to a position where the first measurement means can measure the position of the mark and before the stage stops, the first measurement means and the second measurement means start measuring the position of the mark and the average deviation of the stage, respectively.

In the exposure apparatus according to the second aspect of the present invention, the first measurement means comprises, e.g., an off-axis scope.

In the exposure apparatus according to the second aspect of the present invention, the second measurement means comprises, e.g., an interferometer.

In the exposure apparatus according to the second aspect of the present invention, for example, the substrate has a plurality of areas to be exposed, a mark is formed in correspondence with each area to be exposed, and positions of the plurality of marks while the stage is at rest are detected by the first measurement means, the second measurement means, and the calculation means.

The exposure apparatus according to the second aspect of the present invention further comprises, e.g., positioning means for executing global alignment on the basis of detection results of the positions of the plurality of marks.

In the exposure apparatus according to the second aspect of the present invention, preferably, in an area where the first measurement means can measure the position of the mark, the first measurement means and the second measurement means measure the position of the mark and the average deviation of the stage, respectively, while moving the stage at a predetermined speed, and the calculation means calculates the position of the mark at a state that the stage is at rest on the basis of the measurement results. The predetermined speed is preferably, e.g., a constant speed.

The exposure apparatus according to the second aspect of the present invention preferably further comprises determination means for determining a calculation mode to be applied when the calculation means calculates the position of the mark while the stage is at rest.

In the exposure apparatus according to the second aspect of the present invention, preferably, the determination means determines the correction mode on the basis of the position of the mark and the deviation of the stage, which are measured by the first measurement means and the second measurement means while placing, on the stage, an inspection substrate having a mark formed by exposing a pattern by the exposure apparatus.

According to the third aspect of the present invention, there is provided a position detection method of detecting a position of a mark formed on an object placed on a stage, comprising the first measurement step of measuring a position of a mark formed on the object on the basis of an average image signal of the mark, the second measurement step of measuring an average deviation of the stage, and the calculation step of calculating the position of the mark at a state that the stage is at rest on the basis of a measurement result in the first measurement step and a measurement result in the second measurement step.

According to the fourth aspect of the present invention, there is provided a method of controlling an exposure apparatus having a stage for moving a substrate placed on the stage, and a projecting lens for protecting a pattern onto the substrate, comprising the first measurement step of measuring a position of a mark formed on the substrate on the basis of an average image signal of the mark, the second measurement step of measuring an average deviation of the stage, the calculation step of calculating the position of the mark at a state that the stage is at rest on the basis of a measurement result in the first measurement step and a measurement result in the second measurement step, and the positioning step of driving the stage on the basis of a calculation result in the calculation step to position the substrate at a target position.

According to the fifth aspect of the present invention, there is provided a method of manufacturing a device, comprising the steps of placing a substrate applied with a resist on a stage of the exposure apparatus according to the second aspect of the present invention, aligning the substrate in the exposure apparatus, and transferring a pattern to the substrate in the exposure apparatus.

Further objects, features and advantages of the present invention will become apparent from the following detailed description of the embodiments of the present invention with reference to the accompanying drawings.

BRIEF DESCRIPTION OF THE DRAWINGS

FIG. 12 is a flowchart illustrating the flow of manufacture of a microdevice to which the exposure apparatus of the first through seventh embodiments are capable of being applied; and FIG. 13 is a flowchart illustrating the details of the flow of the semiconductor manufacturing process shown in FIG. 12.

DETAILED DESCRIPTION OF THE PREFERRED EMBODIMENTS

Figure 1:
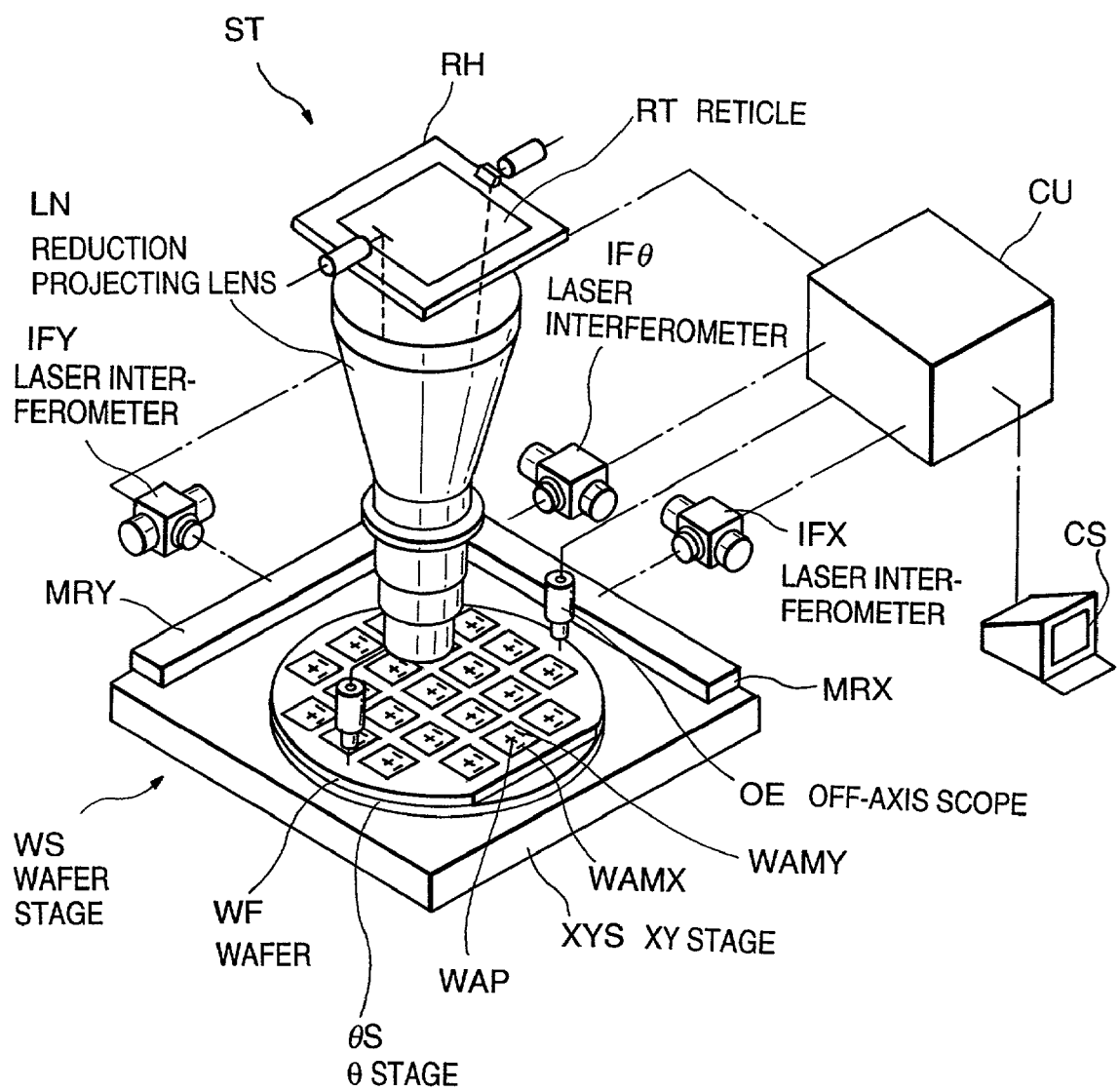
FIG. 1 is a perspective view schematically showing the arrangement of the principal part of a projecting exposure apparatus according to a preferred embodiment of the present invention.
Figure 2:
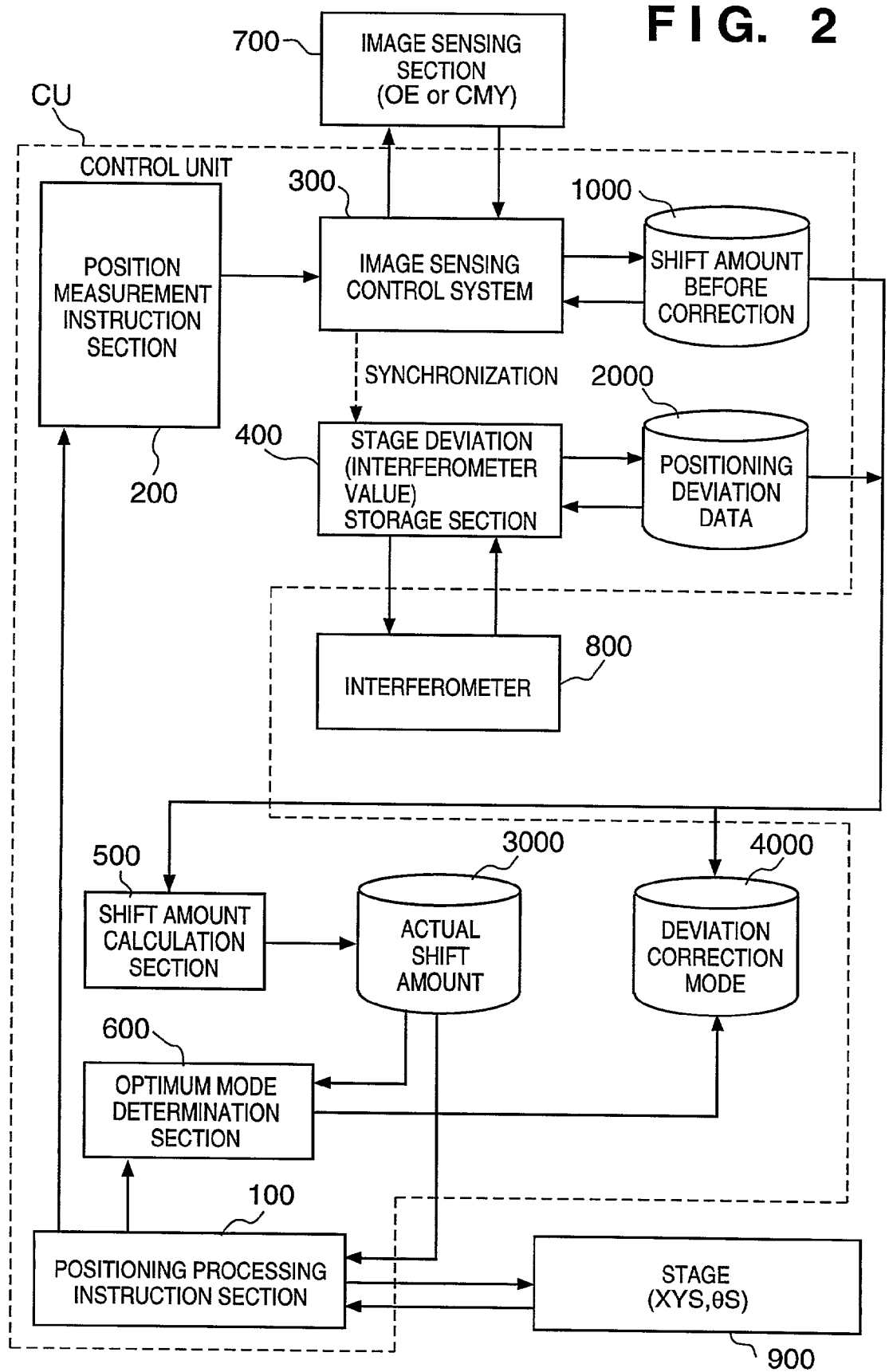
FIG. 2 is a block diagram schematically showing the arrangement of the principal part of the projecting exposure apparatus shown in FIG. 1.
Figure 3:
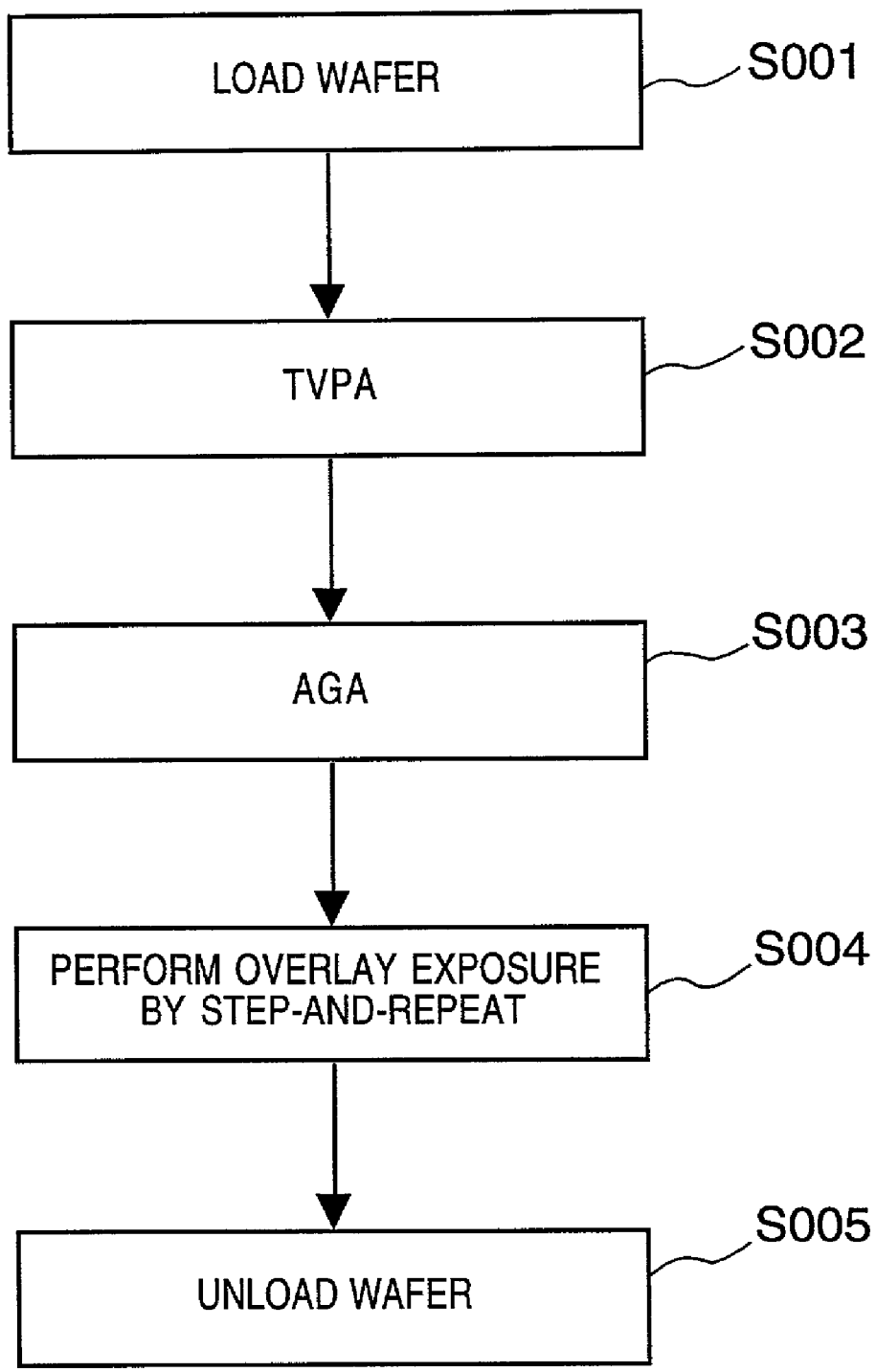
FIGS. 3 to 5 are flow charts schematically showing the operation of the projecting exposure apparatus shown in FIGS. 1 and 2.
Figure 4:
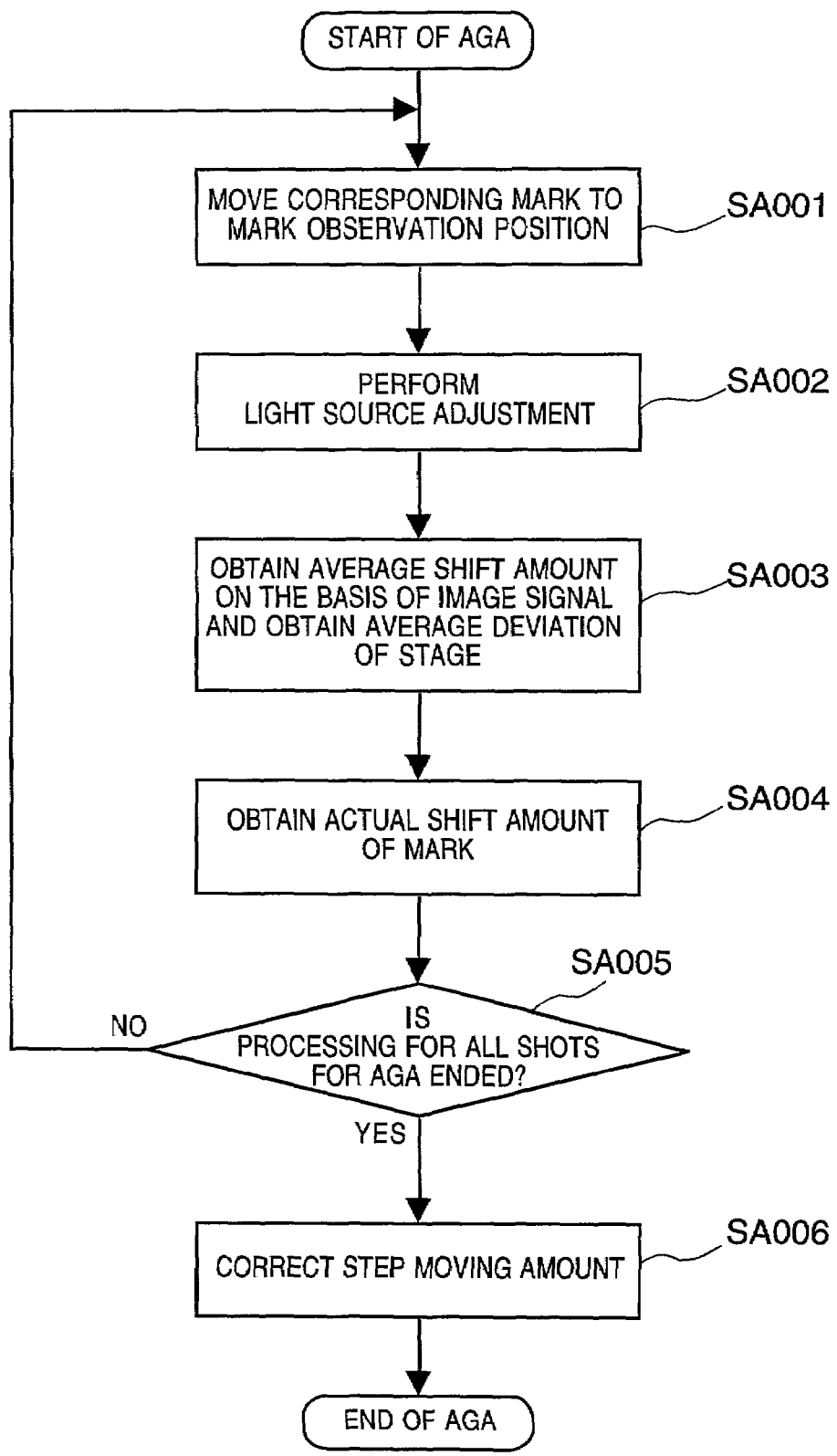
Figure 5:
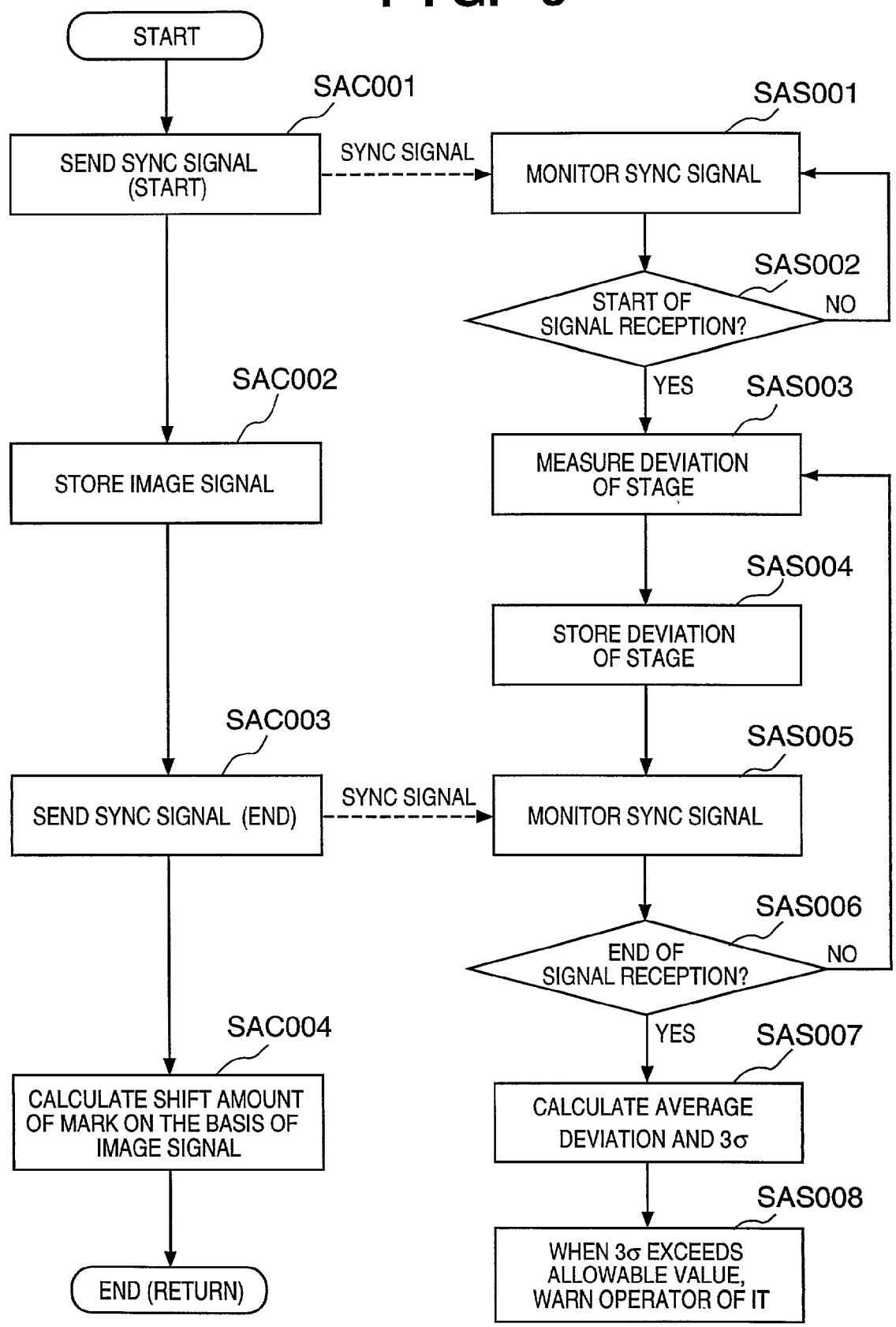
Figure 6:
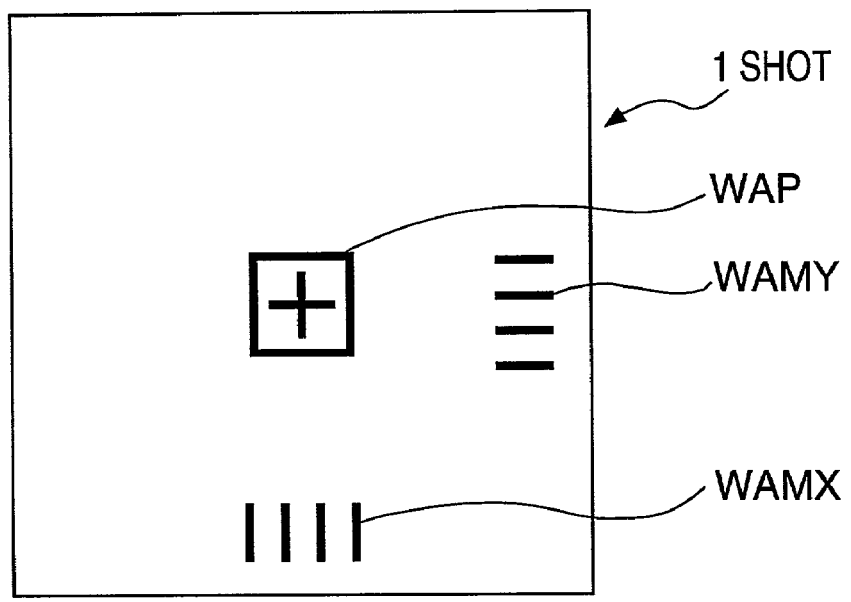
FIG. 6 is an explanatory view of a mark used in the preferred embodiment of the present invention.
Figure 7:
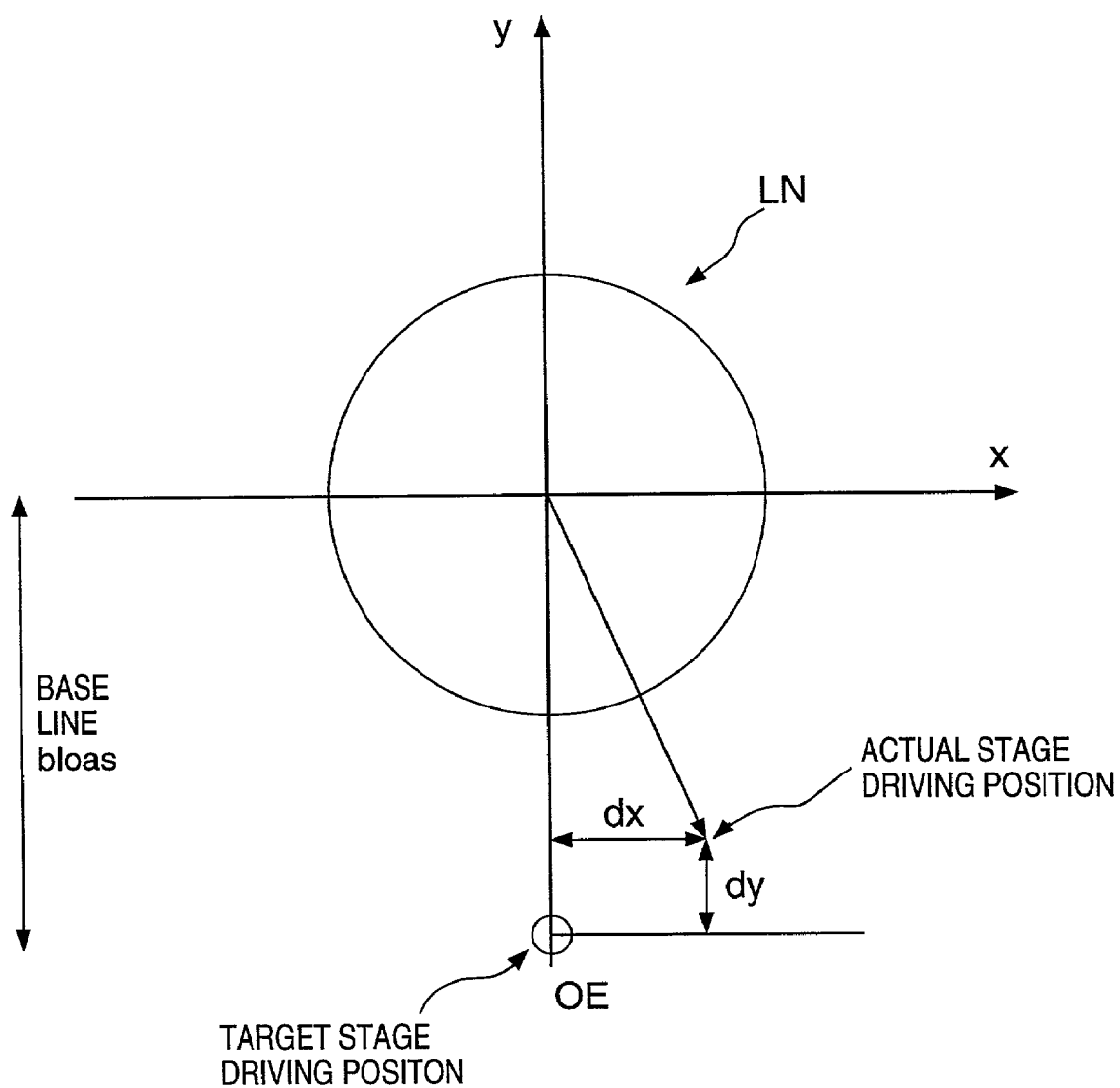
FIG. 7 is a view schematically showing the relationship between an off-axis scope (OE), a reduction projecting lens (LN), a target stage position, and an actual stage position.

FIG. 1 is a perspective view schematically showing the principal part of a projecting exposure apparatus according to the first embodiment of the present invention. FIG. 2 is a block diagram showing the principal part of the projecting exposure apparatus according to the first embodiment of the present invention. FIGS. 3 to 5 are flow charts schematically showing the operation of the projecting exposure apparatus shown in FIGS. 1 and 2. FIG. 6 is a view schematically showing an alignment mark in one shot on a wafer, which is applied to the projecting exposure apparatus shown in FIGS. 1 and 2. FIG. 7 is a view schematically showing the relationship between an off-axis scope (OE), a reduction projecting lens (LN), an actual stage driving position, and a target stage driving position.

A projecting exposure apparatus (stepper) ST according to the first embodiment of the present invention comprises a reticle holder RH for holding a reticle RT, an off-axis scope OE as an image sensing section for sensing images of alignment marks (to also be simply referred to as marks) WAMX and WAMY on a wafer WF, XY stage XYS and θ stage θs for moving the wafer WF, laser interferometer IFX and mirror MRX for measuring the position or deviation (difference between the target position and actual position) of the XY stage in the X direction, laser interferometer IFY and mirror MRY for measuring the position or deviation of the XY stage in the Y direction, laser interferometer IFθ (mirror MRX is shared) for measuring the rotation amount or deviation of the XY stage, and control unit CU, as shown in FIG. 1.

On the wafer WF, a number of shots (areas to be exposed) in which the same patterns are formed in the previous exposure and development processes are arrayed. The alignment mark WAMX for measuring position in the X direction and alignment mark WAMY for measuring position in the Y direction are formed in each shot or at its periphery together with the circuit pattern in the shot.

The off-axis scope OE includes a light source, microscope, and CCD camera for, e.g., observing an alignment mark. The off-axis scope OE forms images of the alignment marks WAMX and WAMY on the wafer WF on the imaging plane of the CCD camera and generates image signals associated with the images of the marks.

In this projecting exposure apparatus ST, the position of the XY stage XYS can be accurately measured by the laser interferometer IFX and mirror MRX in the X-axis direction, the laser interferometer IFY and mirror MRY in the Y-axis direction, and the laser interferometer IFθ and mirror MRX in the θ direction. To measure the position of a mark on the wafer WF, the mark is moved to the observation position of the off-axis scope OE by the XY stage XYS.

In this projecting exposure apparatus ST, the shift amounts of the marks WAMX and WAMY of the WF on the θ stage θS from the target positions are obtained using the off-axis scope and laser interferometers. On the basis of the measurement results, the shift amount between a shot (alignment mark) on the wafer WF and a pattern (more exactly, an image to be projected onto the wafer) formed on the reticle RT is corrected. With this processing, the pattern formed on the reticle RT can be reduced through a reduction projecting lens LN, and projected by exposure to accurately overlap the pattern already formed on the wafer WF (overlay exposure).

Overlay exposure is controlled by the control unit CU. As shown in FIG. 2, the control unit CU comprises a positioning processing instruction section 100, position measurement instruction section 200, image sensing control section 300, stage deviation storage section 400, shift amount calculation section 500, optimum mode determination section 600, and memories 1000 to 4000. The image sensing control section 300 can synchronize the image storage period by an image sensing section (off-axis scope) 700 with the position deviation data storage period by the stage deviation storage section 400.

The image sensing section 700 in FIG. 2 includes the off-axis scope OE shown in FIG. 1. An interferometer 800 in FIG. 2 includes the laser interferometers IFX, IFY, and IFθ and mirrors MRX and MRY shown in FIG. 1. A stage 900 in FIG. 2 includes the stages XYS and θS shown in FIG. 1.

An outline of operation of the projecting exposure apparatus shown in FIGS. 1 and 2 will be described below with reference to the flow chart of FIG. 3. Processing shown in the flow chart of FIG. 3 is controlled by the control unit CU. The devices and control unit CU are connected through cables.

In step S001, the wafer WF is placed at a predetermined position on the θ stage θS on the XY stage XYS by a conveyor unit (not shown; e.g., a conveyor robot) and vacuum-chucked by the θ stage θS.

In step S002, the positions of marks WAP (see, for example, FIGS. 1 and 6) formed in two shots on the wafer WF held by the wafer chuck WS are detected by the off-axis scope OE. On the basis of the detection results, the stages XYS and θS are driven to coarsely set the wafer WF at the reference position.

Since the position of the off-axis scope OE is fixed, a mark on the wafer WF is moved to the observation position of the off-axis scope OE by the stages XYS and θS. To detect the position of a mark on the wafer WF by the off-axis scope OE, non-exposure light is used to suppress damage to the wafer WF.

In step S003, any shift amounts between the positions of the marks WAMX and WAMY and target positions are detected by the off-axis scope OE in all predetermined shots. More specifically, in this step, using the global alignment scheme (AGA), the marks WAMX and WAMY in all of the predetermined shots are sequentially moved to the observation position, and any shift amounts between the positions of the marks WAMX and WAMY and target positions are detected. After this, correction amounts for step movement of the stages XYS and θS are calculated on the basis of the detection results. The correction amounts are stored in the positioning processing instruction section 100 of the control unit CU and used in step-and-repeat exposure operation.

Mark position is detected without waiting until the stage XYS comes to a complete halt as long as the position deviation of the XY stage XYS can be measured by the laser interferometers IFX and IFY.

In step S004, step-and-repeat exposure is executed. By moving the stage (XYS and θS) 900, a corresponding shot on the wafer WF is moved to the exposure position and set. The pattern formed on the reticle RT is reduced to ⅕ by the reduction projecting lens LN by light from the exposure light source, and projected to the resist applied to the wafer WF, so overlay exposure is executed. This operation is repeated for all shots on the wafer WF.

When overlay exposure is ended for all shots, in step S005 the wafer WF is unloaded by a conveyor unit (not shown).

A method of detecting a shift amount of the mark position, which is used in step S003 of FIG. 3 (alignment by the global alignment scheme), will be described next with reference to FIG. 2 and the flow charts of FIGS. 4 and 5.

First, in step SA001, the positioning processing instruction section 100 instructs the stage (XYS and θS) 900 to move a corresponding mark on the wafer WF to the observation position of the image sensing section (OE) 700. After this, before swing of the stage 900 completely settles down, steps SA002 and SA003 are executed.

In step SA002, non-exposure light is emitted by the light source constructing part of the image sensing section 700, and the light source is adjusted.

The image of the mark on the wafer WF, which is illuminated with the non-exposure light, is enlarged through the microscope and formed on the imaging plane of the CCD camera. The microscope and CCD camera partially construct the image sensing section (off-axis scope) 700.

In step SA003, before the stage (XYS and θS) 900 completely stops, i.e., when the stage 900 is still swinging, the image sensing control section 300 causes the CCD camera (image sensing section) to store an image signal (charges) and continue storage until a predetermined observation time elapses.

In the observation period started before the stage (XYS and θS) 900 completely stops, the mark image sensed (stored) by the image sensing section 700 contains swing information. That is, by this storage operation, an image as an average of images of the swinging mark is obtained in the observation period. After the observation period, the image sensing control section 300 causes the image sensing section 700 to end storage of the image and reads out the image signal from the image sensing section 700. The image sensing control section 300 obtains the shift amount of the mark from the target position on the basis of this image signal and stores the shift amount in the memory 1000.

In step SA003, the stage deviation storage section 400 receives the position deviation data of the stage 900 measured by the interferometer (IFX and IFY) 800 during the observation period when the image signal is stored (average) by the CCD camera under control of the image sensing control section 300, and stores the position deviation data in the memory 2000. The stage deviation storage section 400 calculates the average value of position deviations of the stage in the period and 3σ (σ means a variation (standard deviation)) in the position deviation on the basis of position deviation data in the observation period, which is stored in the memory 2000, and stores the average value in the memory 2000. That is, with this processing, average data of errors from the prescribed standing position of the stage during the image signal reception period is obtained. While at rest, the stage is expected to come to a complete halt at this prescribed position. Hence, the obtained data represents swing information of the apparatus.

In step SA004, the shift amount calculation section 500 corrects the previously calculated average shift amount from the target mark position on the basis of the average deviation of the stage, which is stored in the memory 2000, and calculates the actual shift amount of the mark from the target position.

The actual shift amount of the mark is calculated in accordance with a correction mode specified by information stored in the memory 4000. This correction mode is determined by the optimum mode determination section 600 in advance. Information for specifying the determined correction mode is stored in the memory 4000. An example associated with correction mode determination will be described in the second embodiment.

In step SA005, it is determined whether the above measurement processing (SA001 to SA004) is ended for all predetermined shots for AGA. If YES in step SA005, the flow advances to step SA006. If NO in step SA005, the flow returns to step SA001.

In step SA006, the positioning processing instruction section 100 calculates correction amounts to be used for step operation of the stage by AGA on the basis of the information representing the actual shift amount of each mark on the stage, which is stored in the memory 3000.

Processing in step SA003 of FIG. 4 will be described next in more detail with reference to the flow chart of FIG. 5.

In step SAC001, the image sensing control section 300 sends a sync signal to the stage deviation storage section 400 and then causes the image sensing section (OE) 700 to execute image signal storage operation in step SAC002.

In steps SAS001 and SAS002, the stage deviation storage section 400 which is monitoring reception of a sync signal receives the sync signal from the image sensing control section 300 and recognizes that the image sensing section 700 has started image signal storage, and the flow advances to step SAS003. In step SAS003, the stage deviation storage section 400 directs the interferometer 800 to start measurement of the position deviation of the stage (XYS) 900. In step SAS004, the stage deviation storage section 400 stores position deviation data already supplied from the interferometer 800 in the memory 2000. That is, image signal storage by the image sensing section 700 and reception and storage of position deviation data by the stage deviation storage section 400 start in synchronism with each other.

When the observation period elapses, and image signal storage is ended, the image sensing control section 300 sends a sync signal to the stage deviation storage section 400 in step SAC003 to notify the stage deviation storage section 400 of completion of image signal storage.

In step SAC004, the image sensing control section 300 reads out the stored (average) image signal from the image sensing section 700, calculates the shift amount of the corresponding mark within the observation period on the basis of the readout signal, and stores the shift amount in the memory 1000.

On the other hand, in step SAS005 in the loop formed from steps SAS003 to SAS006, the stage deviation storage section 400 which is monitoring reception of a sync signal from the image sensing control section 300 receives the sync signal from the image sensing control section 300, and the flow advances to step SAS007. That is, image signal storage by the image sensing section 700 and reception and storage of position deviation data by the stage deviation storage section 400 end in synchronism with each other.

In step SAS007, the stage deviation storage section 400 calculates the average value and 3σ of position deviation of the stage (XYS) 900 from the position deviation data stored in the memory 2000 during the observation period, and stores them in the memory 2000.

In step SAS008, when the value 3σ exceeds a predetermined allowable value, the operator is warned of it using an operation terminal CS (FIG. 1).

A method of correcting the shift amount of the mark in the observation period, which is obtained using the image signal supplied from the CCD camera, on the basis of the average position deviation of the stage (XYS) 900 in the observation period and obtaining the actual shift amount of the mark from the target position (steps SA003 and SA004) will be described next in detail.

FIG. 6 is a view showing an example of an alignment mark on a wafer. In this example, each shot has an alignment mark WAMX for the X direction and alignment mark WAMY for the Y direction. In this embodiment, on the basis of an average image signal read out from the image sensing section (OE) 700, a central position MCX of the mark WAMX and central position MCY of the mark WAMY, i.e., the central coordinates (MCX, MCY) of the shot are detected as the shift amounts of the two marks. The shift amounts are expressed on the coordinate system of the image sensing section 700. For example, when the mark matches the target position (shift amount is zero), the central portion of the image sensed by the CCD camera of the image sensing section 700 matches the central portion of the mark. If the mark does not match the target position, the shift amount is specified on the coordinate system (e.g., a coordinate system with its origin (0,0) at the center) of the image sensing section 700.

After step SA003 of FIG. 4, for example, an average position deviation dx of the stage (XYS) 900 in the observation period and average position deviation dy in the Y direction, which are measured by the laser interferometer IFX in the X direction and laser interferometer IFY in the Y direction, and threefold values 3σx and 3σy of variations (standard deviations) σx and σy in the position deviation are stored in the memory 2000.

When the stage (XYS) 900 is positioned and simultaneously completely stopped, the actual position and target position of the stage 900 can be matched with each other. However, in step SA003, before the stage 900 completely stops, any position deviation of the stage 900 is measured. This means that the position deviation of the stage is measured without matching the actual driving position with the target driving position of the stage 900. Hence, the shift amount of a mark, which is calculated on the basis of an image signal read out from the image sensing unit 700, does not match the actual shift amount, either.

More specifically, the average central positions MCX and MCY of the marks WAMX and WAMY shift from the actual shift amounts (positions) by dx and dy, respectively. Hence, the actual shift amounts of the marks WAMX and WAMY are given by MCX−dx and MCY−dy, respectively. More specifically, the actual shift amount of the mark WAMX in the X direction is calculated in accordance with (MCX−dx), and the actual shift amount of the mark WAMY in the Y direction is calculated in accordance with (MCY−dy).

FIG. 7 is a view schematically showing the relationship between the off-axis scope (OE), reduction projecting lens (LN), target stage driving position, and actual stage driving position (average position). The base line bloas represents the offset value between the optical axis of the reduction projecting lens and that of the off-axis scope. In step movement for actual exposure, the stage is driven in consideration of this offset value. The average deviations dx and dy are small values in fact, though they have large values in FIG. 7 for descriptive convenience.

In the above example, the shift amount (position) of a mark measured by the off-axis scope before the stage completely stops is corrected on the basis of the measurement results of average deviations of the stage, which are measured by the laser interferometers in the X and Y directions. However, evaluation need not always be done by this method. The measured mark position may be corrected using the stage deviation except those along the X and Y axes. The stage position may be measured by a measurement instrument of another type. The mode determination section 600 determines the correction mode (e.g., an arithmetic expression to be used for correction) in accordance with setting for devices such as laser interferometers to be used, installation state of the apparatus, floor state, and the like.

FIG. 6 shows a representative alignment mark. However, the alignment mark is not limited to this, and any other alignment mark can be used as far as it allows measurement of the position of a shot.

In this embodiment, the image sensing section 700 and image sensing control section 300 construct a means for calculating the shift amount (or position) of a mark assuming that the stage (XYS) 900 has no deviation. The interferometer 800 constructs a means for estimating the deviation of the stage while the stage (XYS) 900 is at rest. The shift amount calculation section 500 constructs a means for correcting the shift amount (i.e., shift amount including a deviation) of the mark, which is calculated assuming that the stage (XYS) 900 has no deviation, on the basis of the estimated deviation of the stage while the stage is at rest, thereby calculating the actual shift amount (or position) of the mark.

In this embodiment, when the above arrangement is incorporated in the semiconductor element manufacturing line (apparatus), actual position measurement can be performed, and the accuracy of the global alignment scheme can be improved. According to this embodiment, the reliability of a measurement value obtained by simple measurement for alignment can be improved. In addition, according to this embodiment, even when the stage position varies, the position can be accurately measured by measuring the variation and reflecting the result on the mark measurement result.

According to this embodiment, even before the stage completely stops, i.e., even when the stage position is varying, the shift amount or position of a mark formed on a wafer on the stage can be accurately measured. Hence, processing need not wait until the stage completely stops, and the time required for alignment such as global alignment can be greatly shortened to improve the throughput.

Figure 8:
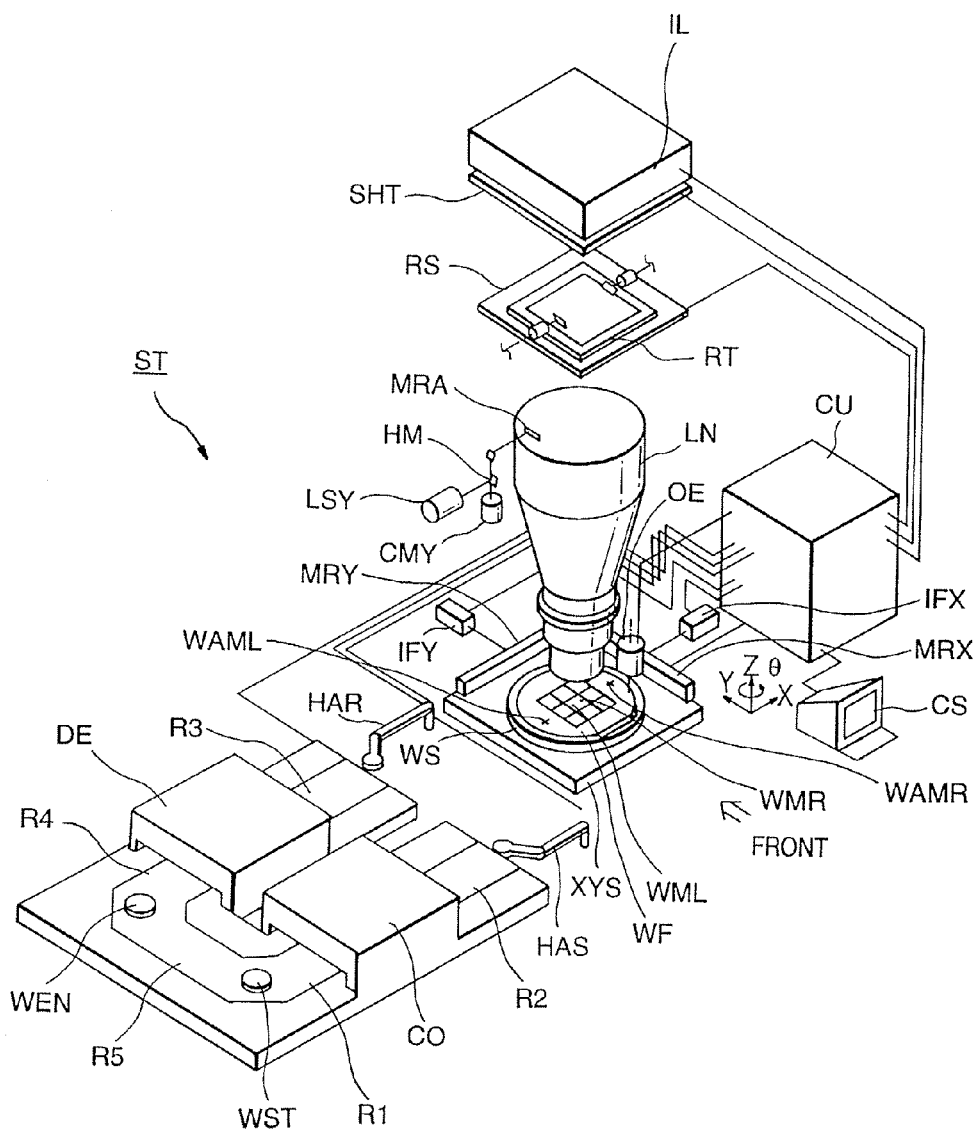
FIG. 8 is a perspective view schematically showing the arrangement of the principal part of an exposure apparatus with an inspection function according to another preferred embodiment of the present invention.

FIG. 8 is a perspective view schematically showing the arrangement of the principal part of an exposure apparatus with an inspection function according to the second embodiment of the present invention. This apparatus has a coater CO, projecting exposure apparatus ST, and developer DE. The coater CO has a function of applying a resist to a wafer WF. The developer DE has a function of developing an inspection wafer exposed by the projecting exposure apparatus ST. FIG. 2 is a block diagram showing the principal part of the projecting exposure apparatus ST.

In this exposure apparatus with inspection function, the projecting exposure apparatus ST is automatically inspected while moving an inspection wafer placed at the entrance of the coater CO between the apparatuses CO, ST, and DE in accordance with an instruction from a control unit CU. More specifically, an alignment mark pattern is transferred to the resist on an inspection wafer by exposure using the projecting exposure apparatus ST, and the wafer is developed to form an alignment mark. After this, the position of the mark is measured in the projecting exposure apparatus ST. In this exposure apparatus with an inspection function, the correction mode is determined on the basis of the mark position measurement result (SA110 in FIG. 10).

Additionally, in this exposure apparatus with an inspection function, for example, the alignment accuracy or process offset value is calculated on the basis of the mark position measurement result. These results are used as correction values for wafer alignment in the projecting exposure apparatus ST.

For example, a wafer is selected from wafers for manufacturing one product lot as an inspection wafer and used for inspection.

Figure 9:
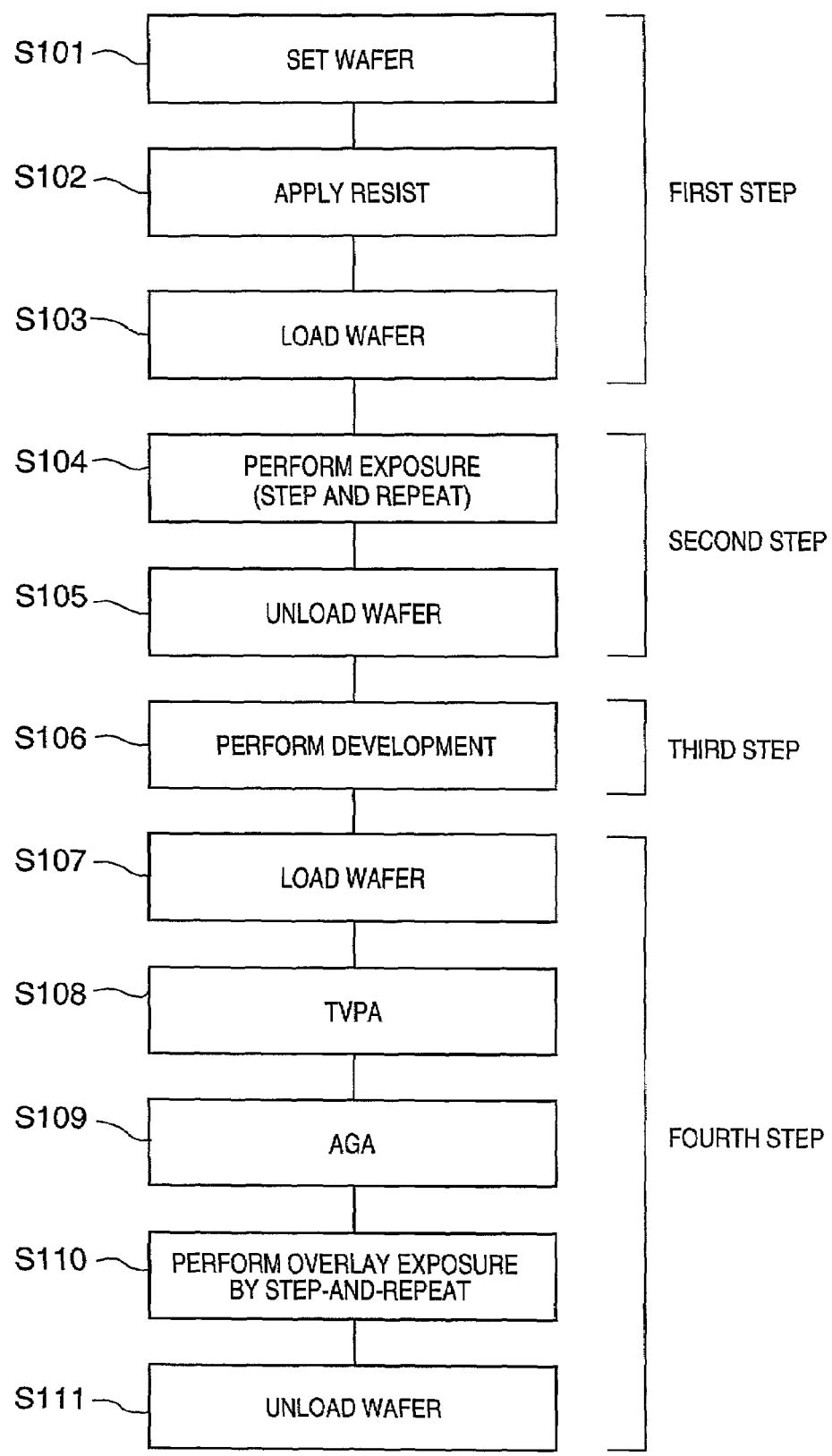
FIGS. 9 and 10 are flow charts schematically showing the operation of the apparatus shown in FIG. 8.

The operation of the exposure apparatus with an inspection function according to the second embodiment will be described next with reference to FIGS. 8 and 9. Processing shown in FIG. 9 is controlled by the control unit CU. The apparatuses and control unit CU are connected through communication cables.

In the first step (S101 to S103), the inspection wafer WF is placed on a wafer set table WST (S101). The wafer passes through a conveyance path R1 and is conveyed to the coater (resist application apparatus) CO, so that a resist is applied to the surface of the wafer. The wafer WF is sent to the projecting exposure apparatus ST through a conveyance path R2, placed on a wafer chuck WS on a θ stage θS by an automatic handler HAS, and vacuum-chucked (S103).

In the second step (S104 and S105), the exposure shutter is opened, and a pattern drawn on a reticle RT held by a reticle stage RS is projected onto the resist applied to the wafer WF through a projecting lens LN to expose it (S104). More specifically, light from a light source IL is incident on the projecting lens LN through a masking blade SHT and reticle Rt. The image of the pattern formed on the reticle RT is reduced to ⅕ by the projecting lens LN and projected onto the resist applied to the wafer WF. At this time, the pattern of an alignment mark to be used in the fourth step is formed on the resist by exposure. This exposure is executed for all shots while moving an XY stage XYS.

When exposure of all shots is ended, the wafer WF is sent from the wafer chuck WS to a loading path R3 of the developer (developing apparatus) DE by a recovery handler HAR (S105).

In the third step (S106), the wafer WF sent to the conveyance path R3 arrives at the developer DE and is developed. When development is ended, the wafer WF is sent to a loading path R5 through a wafer loading path R4.

In the fourth step (S107 to S111), the wafer WF is sent to the loading path R2 through the coater CO, placed on the wafer chuck WS on the θ stage by the automatic handler HAS, and vacuum-chucked (S107). In this step, the wafer WF passes through the coater CO without being applied with a resist in the coater CO.

The positions of two alignment marks WAML and WAMR on the wafer placed on the wafer chuck WS are measured by an off-axis optical system (off-axis scope) OE. The wafer WF is coarsely positioned by driving the stages XYS and θS on the basis of the measurement result.

The positions of alignment marks WML and WMR in each shot are measured by the TTL off-axis scheme, and global alignment is performed on the basis of the measurement results (S109). More specifically, non-exposure light emitted by non-exposure light source LSY, (see, for example, FIG. 8), e.g., a HeNe laser is transmitted through a half mirror HM, reflected by a mirror MRA, and transmitted through the projecting lens LN to irradiate the alignment mark WML on the wafer WF. The non-exposure light reflected by the wafer WF is transmitted through the projecting lens LN, reflected by the mirror MRA, and transmitted through the half mirror HM to be incident on a CCD camera CMY (see, for example, FIG. 2). With this operation, the image of the alignment mark WML is formed on the imaging plane of the CCD camera CMY. Next, the XY stage XYS is moved to form the image of the alignment mark WMR formed on the opposite side of the alignment mark WML on the imaging plane of the CCD camera CMY.

Image signals from the CCD camera CMY are processed by the control unit CU to measure the position of the alignment marks WML and WMR in the Y direction. As in the first embodiment, this measurement is executed before the XY stage XYS comes to a complete stop. As measurement results, average shift amounts of the marks during the observation period are obtained. These measurement results are corrected on the basis of the average deviation of the stage XYS during the observation period, which is measured by a laser interferometer, to calculate the actual shift amounts of the marks. At this time, 3σ associated with a variation in deviation of the stage XYS is also calculated, as in the first embodiment.

After this processing is executed for all predetermined shots for global alignment while moving the XY stage XYS, correction amounts for step movement of the stage XYS are calculated on the basis of the obtained actual shift amounts of marks. Examples of the correction amounts are a correction amount associated with rotation about the X axis (Rotx), correction amount associated with rotation about the Y axis (Roty), correction amount associated with the magnification along the X axis (Magx), and correction amount associated with the magnification along the Y axis (Magy). These correction amounts are stored in the control unit CU.

When the value 3σ exceeds an allowable value, the operator is warned of it using an operation terminal CS.

After global alignment is ended, virtual exposure for the wafer WF is executed sequentially from the first shot to the final shot while driving the XY stage XYS by the step and repeat scheme (S110). At this time, light from the exposure light source IL passes through the masking blade MB and reticle RT and enters the projecting lens LN. The image of a pattern formed on the reticle RT is reduced to ⅕ by the projecting lens LN and projected onto the resist applied to the wafer WF. When one shot is exposed, the XY stage XYS moves to execute exposure of the next shot.

The wafer WF for which all shots are exposed is sent from the wafer chuck WS to the loading path R3 of the developing apparatus by the recovery handler HAR. The wafer WF is sent to the loading path R4 without being developed, sent to a wafer reception table WEN, and unloaded (S111).

Figure 10:
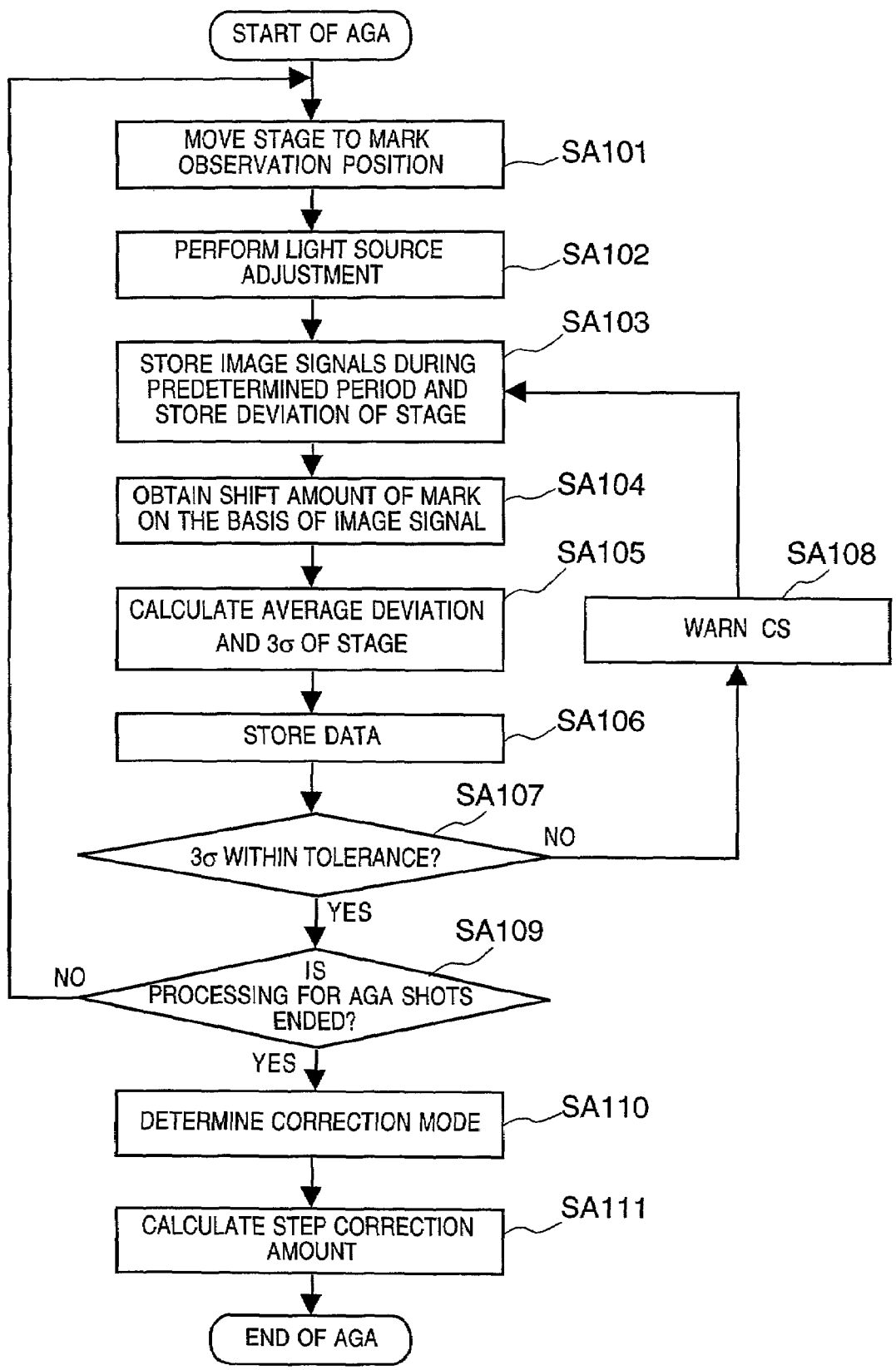

Processing in step S109 of FIG. 9 will be described next in more detail with reference to FIG. 10.

In step SA101, a positioning instruction section 100 instructs a stage (XYS and θS) 900 to move a corresponding mark on the wafer WF to the observation position of an image sensing section (CMY) 700. After this, steps SA102 and SA103 are executed before swing of the stage (XYS and θS) 900 subsides completely.

In step SA102, non-exposure light is emitted by the light source constructing part of the image sensing section (CMY) 700, and the light source is adjusted.

The image of the mark on the wafer WF illuminated with the non-exposure light is formed on the imaging plane of the CCD camera CMY. The CCD camera CMY partially constructs the image sensing section (TTL off-axis scope) 700.

In step SA103, an image sensing control section 300 causes the CCD camera CMY to start storage of the mark image before the stage (XYS and θs) 900 completely stops, i.e., when the stage 900 is still swinging, and continue this storage until a predetermined observation time elapses.

In step SA103, a stage deviation storage section 400 receives position deviation data of the stage from an interferometer (IFX, MRX, IFY, MRY, and IFθ) 800 during the observation period when image signals are received by the CCD camera CMY, and stores the data in a memory 2000.

In step SA104, the image sensing control section 300 reads out an image signal associated with the average mark image during the observation period from the image sensing section 700 and calculates, e.g., the shift amount of the mark from the target position during the observation period on the basis of the image signal.

In step SA105, the stage deviation storage section 400 calculates the average deviation value and 3σ (σ means a variation) of the stage 900 during the observation period on the basis of the position deviation data during the observation period, which is stored in the memory 2000. The position deviation data includes the x and y components of the stage XYS and θ component of the stage θS.

In step SA106, data representing the shift amount of the mark, which is calculated in step SA104, is stored in a memory 1000. In addition, the average deviation and 3σ of the stage, which are calculated in step SA105, are stored in the memory 2000.

In step SA107, it is determined whether the value 3σ calculated in step SA105 falls within a predetermined allowable range. If YES in step SA107, the flow advances to step SA109. If the value 3σ exceeds the allowable value, the operator is warned of it using the terminal CS in step SA108, and the flow returns to step SA103 to measure the position of the mark in the shot again.

In step SA109, it is determined whether the above measurement processing (SA101 to SA108) is ended for all predetermined shots for AGA. If YES in step SA109, the flow advances to step SA110. If NO in step SA109, the flow returns to step SA101.

In step SA110, the mode determination section 600 determines an optimum correction mode (e.g., an arithmetic expression to be used for correction) on the basis of the shift amounts of the marks obtained in step SA104 and position deviation data, and stores information for specifying the mode in a memory 4000.

In step SA111, in accordance with the correction mode specified by the information stored in the memory 4000, the actual shift amounts of marks are calculated on the basis of the shift amounts of marks, which are stored in the memory 1000, and average position deviation of the stage 900, which is stored in the memory 2000, and the calculation results are stored in a memory 3000. In addition, the alignment accuracy or process offset value can be effectively calculated and used as a correction value for wafer alignment in the subsequent processing (actual exposure processing).

In step SA111, correction amounts for step movement of the stage 900 are calculated on the basis of information representing the actual shift amount (or position) of each mark.

A method of correcting the shift amount of each mark, which is detected by the TTL off-axis scheme, will be described next. Assume that the image sensing control section 300 detects central positions MCX and MCY of marks in the X and Y directions as shift amounts from target positions on the basis of image signals supplied from the CCD camera CMY. When step SA106 is executed, average deviation in the X direction and average deviation in the Y direction of the stage (XYS) 900 during the observation period, which are measured by the laser interferometer IFX in the X direction and laser interferometer IFY in the Y direction, and threefold values 3σx and 3σy of variations (standard deviations) σx and σy in the deviation are stored in the memory 2000.

The actual shift amounts (positions) of the marks are obtained by correcting the measured central positions MCX and MCY of the marks using dx and dy. More specifically, the actual shift amounts of the marks in the X and Y directions are given by MCX−dx, and MCY−dy, respectively.

For example, when the deviation dx of the stage 900 in the X direction is small, and the measured mark position in the X direction need not be corrected, a correction mode for correcting only the mark position in the Y direction without correcting the mark position in the X direction may be determined by the mode determination section 600.

Figure 11:
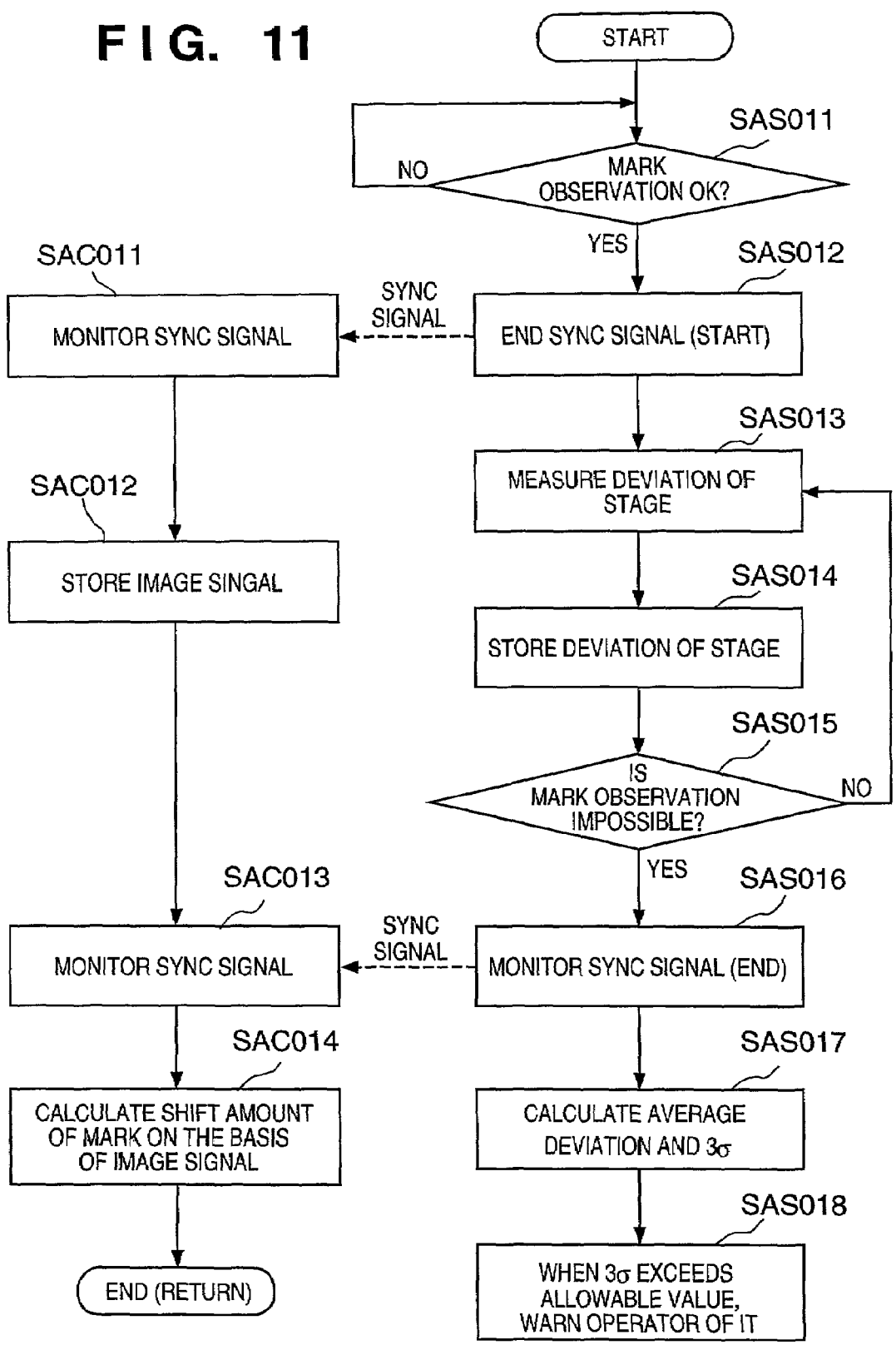
FIG. 11 is a flow chart showing the flow of processing by the projecting exposure apparatus shown in FIGS. 1 and 2.

FIG. 11 is a flow chart showing the flow of processing according to the third embodiment of the present invention. In this embodiment, the procedure (steps SA003 in FIG. 4 and FIG. 5) of measurement in the first embodiment is changed. Only portions different from the first embodiment will be described.

In this embodiment, the shift amount of a mark from the target position is detected while moving a stage (XYS and θS) 900. More specifically, in this embodiment, when a corresponding mark on a wafer passes through an observation area of an image sensing section (off-axis scope OE) 700, the stage 900 on which the wafer is placed is moved at a constant speed. When the mark passes through the observation area, the image sensing section (off-axis scope OE)

700 detects the shift amount of the mark and simultaneously detects the position deviation of the stage 900. On the basis of the two detection results, the actual shift amount of the mark is detected.

First, in step SAS011, a stage deviation storage section 400 determines on the basis of target position data of the stage 900 whether the stage 900 has reached a position (observation area) where the image sensing section (OE) 700 can observe a corresponding mark. If YES in step SAS011, the stage deviation storage section 400 sends a sync signal for starting observation to the image sensing control section 300 in step SAS012.

In step SAS013, the stage deviation storage section 400 starts measuring the position deviation of the stage (XYS and θS) 900. The measurement result is stored in a memory 2000 by the stage deviation storage section 400 in step SAS014.

Next, in step SAS015, the stage deviation storage section 400 determines whether the corresponding mark has passed through the observation area. If NO in step SAS015, the flow returns to step SAS013 to continue measurement processing. If YES in step SAS015, the flow advances to step SAS015 (end of storage of position deviation data).

In step SAS016, the stage deviation storage section 400 sends a sync signal representing an end of observation to the image sensing control section 300. In step SAS017, the stage deviation storage section 400 calculates average deviations dx and dy of the stage (XYS and θS) 900 in the X and Y directions, and 3σ of the deviations on the basis of the position deviation data stored in the memory 2000, and stores the values in the memory 2000.

In SAS018, when the value 3σ exceeds a predetermined allowable value, the operator is warned of it using an operation terminal CS (FIG. 1).

On the other hand, the image sensing control section 300, which monitors reception of a sync signal in step SAC011, receives the sync signal from the stage deviation storage section 400 and recognizes that the stage deviation storage section 400 has started storing the position of the stage 900, and the flow advances to step SAC012.

In step SAC012, the image sensing control section 300 causes the image sensing section (OE) 700 to execute storage (synthesis) of image signals. In step SAC013, the image sensing control section 300 receives a sync signal from the stage deviation storage section 400, recognizes that the stage deviation storage section 400 ends storage of position deviation data of the stage 900, and ends storage of image signals.

In step SAC014, the image sensing control section 300 calculates average shift amounts MCX and MCY of marks during the observation period on the basis of stored image signals, and stores them in a memory 1000 as measurement results.

The shift amount (position) is the average value of shift amounts from the target position of the mark which is moving at a constant speed during the observation period. The average deviation calculated in step SAS007 is average deviation from the target position of the stage 900 which is moving at a constant speed during the observation period. Hence, when the mark shift amount calculated in step SAS014 is corrected on the basis of the average deviation of the stage 900, which is calculated in step SAS017, the actual shift amount of the mark on the stage 900 from the target position can be calculated.

According to the third embodiment, since the shift amount of a mark on a wafer can be detected while moving the stage, alignment such as global alignment can be performed at a high speed.

The above embodiments are also preferable for measurement of the position of a mark on a wafer when a predetermined time has elapsed after stopping the stage (for example, after a time in which swing is expected to generally settle down has elapsed). In this case, mark position measurement errors due to vibration of the floor can be prevented.

According to the above embodiments, the shift amount of a mark from the target position, which is measured by sensing the image of the mark by the image sensing section, is corrected on the basis of the deviation of the stage. With this processing, the actual shift amount of the mark can be obtained.

According to the above embodiments, since alignment is performed on the basis of the actual shift amount of a mark, alignment accuracy becomes high.

According to the first and second embodiments, when the stage swing state allows measurement of deviation of the stage, the shift amount of a mark on an object placed on the stage can be accurately measured even before the stage completely stops.

According to the above embodiments, since the function of determining a correction mode is prepared, an appropriate correction mode can be selected in accordance with the state of the apparatus or floor. Hence, stable alignment can be realized.

According to the above embodiments, even when the stage is swinging or moving, the actual shift amount of an object on the stage can be obtained. For this reason, especially, global alignment can be performed at a high speed. Particularly, according to the above embodiments, since processing need not wait until the stage stops, global alignment can be performed at a high speed.

An embodiment of a method of manufacturing a device using the exposure apparatus described above will be described next.

FIG. 12 shows the flow of manufacturing a semiconductor device (e.g., a semiconductor chip such as an IC or an LSI, a liquid crystal panel, or a CCD).

In step S1 (circuit design), the circuit of a semiconductor device is designed. In step S2 (mask preparation), a mask having the designed circuit pattern is prepared.

In step S3 (wafer manufacturing), a wafer is manufactured using a material such as silicon. In step S4 (wafer process), called a preprocess, an actual circuit is formed on the wafer by lithography using the prepared mask and wafer.

In step S5 (assembly), called a post-process, a semiconductor chip is formed from the wafer prepared in step S4. This step includes processes such as assembly (dicing and bonding) and packaging (chip encapsulation).

In step S6 (inspection), inspections including operation check test and durability test of the semiconductor device manufactured in step S5 are performed. A semiconductor device is completed with these processes and delivered (step S7).

FIG. 13 shows a detailed flow of the wafer process. In step S11 (oxidation), the surface of the wafer is oxidized. In step S12 (CVD), an insulating film is formed on the wafer surface.

In step S13 (electrode formation), an electrode is formed on the wafer by deposition. In step S14 (ion implantation), ions are implanted into the wafer. In step S15 (resist process), a photosensitive material is applied to the wafer. In step S16 (exposure), the circuit pattern of the mask is printed on the wafer by exposure using the above-described exposure apparatus.

In step S17 (development), the exposed wafer is developed. In step S18 (etching), portions other than the developed resist image are etched. In step S19 (resist peeling), unnecessary resist remaining after etching is removed. By repeating these steps, a multilayered structure of circuit patterns is formed on the wafer.

When the manufacturing method of this embodiment is used, a semiconductor device with a high degree of integration, which is conventionally difficult to manufacture, can be manufactured.

The present invention is not limited to the above embodiments and various changes and modifications can be made within the spirit and scope of the present invention. Therefore, to apprise the public of the scope of the present invention, the following claims are made.

What is claimed is:

1. An exposure apparatus for exposing a wafer to a pattern, said apparatus comprising:
    a stage configured to hold the wafer and to move;
    a scope having an image sensor and configured to obtain image data, said image sensor being configured to store image signals corresponding to an image of a mark formed on said image sensor during an image storage period of said image sensor and to supply the stored image signals as the image data, the mark being held by said stage;
    a laser interferometer configured to measure a deviation of said stage, the deviation being a difference between a target position of said stage and an actual position of said stage; and
    a controller configured to calculate an average of a plurality of the deviations of said stage measured by said laser interferometer during the image storage period, to calculate a position of the mark based on the image data obtained by said scope and data of the calculated average, and to control a position of said stage based on the calculated position of the mark.

2. An apparatus according to claim 1, wherein said image sensor is a CCD camera.

3. An apparatus according to claim 1, wherein said scope and said laser interferometer are configured so that obtaining the image data by said scope and measuring the plurality of the deviations of said stage by said laser interferometer are performed in sync with each other based on a sync signal.

4. An apparatus according to claim 1, wherein said scope is configured to send a sync signal to said laser interferometer in accordance with the image storage period of said image sensor.

5. An apparatus according to claim 1, wherein said laser interferometer is configured to send a sync signal to said scope based on the deviation of said stage measured by said laser interferometer.

6. An apparatus according to claim 1, wherein said scope is an off-axis scope.

7. An apparatus according to claim 1, wherein said scope is configured to obtain, as the image data, image data of a mark formed on the wafer.

8. An apparatus according to claim 1, wherein said controller is configured to cause said stage to move at a constant speed during the image storage period of said image sensor.

9. An apparatus according to claim 1, wherein said controller is configured to determine a mode to be applied to the calculation of the position of the mark.

10. A method of manufacturing a device, said method comprising steps of:
    exposing a wafer to a pattern using an exposure apparatus as defined in claim 1;
    developing the exposed substrate; and
    processing the developed substrate to manufacture the device.

* * * * *

UNITED STATES PATENT AND TRADEMARK OFFICE
CERTIFICATE OF CORRECTION

PATENT NO.       : 7,170,603 B2
APPLICATION NO.  : 09/343093
DATED            : January 30, 2007
INVENTOR(S)      : Shoshi Katayama It is certified that error appears in the above-identified patent and that said Letters Patent is hereby corrected as shown below:

IN THE DRAWINGS:
"Sheet 11 of 13," "FIG. 11," in the box labeled "SAC012," "SINGAL" should read -- SIGNAL --.

COLUMN 2:
After line 42 and before line 44, insert the following paragraph.
-- The present invention has been made in consideration of the above situation, and has as its object to increase the alignment accuracy and/or to increase the alignment speed. --

COLUMN 9:
Line 32, "and 36" should read -- and $3\sigma$ --.

COLUMN 11:
Line 27, "inspection" should read -- an inspection --.

COLUMN 12:
Line 2, "reticle Rt." should read -- reticle RT. --.

COLUMN 13:
Line 38, "continue" should read -- to continue --.

COLUMN 15:
Line 60, "average" should read -- the average --.

UNITED STATES PATENT AND TRADEMARK OFFICE
CERTIFICATE OF CORRECTION

PATENT NO. : 7,170,603 B2
APPLICATION NO. : 09/343093
DATED : January 30, 2007
INVENTOR(S) : Shoshi Katayama It is certified that error appears in the above-identified patent and that said Letters Patent is hereby corrected as shown below:

<u>COLUMN 16:</u>
Line 55, "operation" should read -- an operation --
Line 56, "durability" should read -- a durability --.

Signed and Sealed this

Twenty-eighth Day of August, 2007

JON W. DUDAS
*Director of the United States Patent and Trademark Office*